United States Patent
Kanarik et al.

(10) Patent No.: US 10,304,659 B2
(45) Date of Patent: *May 28, 2019

(54) ALE SMOOTHNESS: IN AND OUTSIDE SEMICONDUCTOR INDUSTRY

(71) Applicant: Lam Research Corporation, Fremont, CA (US)

(72) Inventors: Keren Jacobs Kanarik, Los Altos, CA (US); Samantha Tan, Fremont, CA (US); Thorsten Lill, Santa Clara, CA (US); Meihua Shen, Fremont, CA (US); Yang Pan, Los Altos, CA (US); Jeffrey Marks, Saratoga, CA (US); Richard Wise, Los Gatos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/952,834

(22) Filed: Apr. 13, 2018

(65) Prior Publication Data

US 2018/0233325 A1    Aug. 16, 2018

Related U.S. Application Data

(63) Continuation of application No. 15/253,481, filed on Aug. 31, 2016, now Pat. No. 9,984,858.
(Continued)

(51) Int. Cl.
*H01J 37/32* (2006.01)
*H01L 21/321* (2006.01)
(Continued)

(52) U.S. Cl.
CPC .............. *H01J 37/321* (2013.01); *C23F 4/00* (2013.01); *G03F 1/22* (2013.01); *G03F 1/60* (2013.01);
(Continued)

(58) Field of Classification Search
None
See application file for complete search history.

(56) References Cited

U.S. PATENT DOCUMENTS

| 4,592,801 A | 6/1986 | Hara et al. |
| 6,022,806 A | 2/2000 | Sato et al. |

(Continued)

FOREIGN PATENT DOCUMENTS

| WO | WO 2011/081921 A2 | 7/2011 |
| WO | WO 2016/100873 A1 | 6/2016 |
| WO | WO 2017/099718 A1 | 6/2017 |

OTHER PUBLICATIONS

U.S. Office Action dated May 5, 2016 issued in U.S. Appl. No. 14/749,285.
(Continued)

*Primary Examiner* — Allan W. Olsen
(74) *Attorney, Agent, or Firm* — Weaver Austin Villeneuve & Sampson LLP (57) ABSTRACT

Methods of etching and smoothening films by exposing to a halogen-containing plasma and an inert plasma within a bias window in cycles are provided. Methods are suitable for etching and smoothening films of various materials in the semiconductor industry and are also applicable to applications in optics and other industries.

20 Claims, 7 Drawing Sheets

Related U.S. Application Data (60) Provisional application No. 62/214,813, filed on Sep. 4, 2015.

(51) Int. Cl.

| | | |
|---|---|---|
| H01L 21/3105 | (2006.01) | |
| H01L 21/3213 | (2006.01) | |
| H01L 21/302 | (2006.01) | |
| H01L 21/3065 | (2006.01) | |
| H01L 21/311 | (2006.01) | |
| G03F 1/60 | (2012.01) | |
| C23F 1/22 | (2006.01) | |
| G03F 1/22 | (2012.01) | |
| C23F 4/00 | (2006.01) | |
| H01L 21/306 | (2006.01) | |

(52) U.S. Cl.
CPC ........ *H01L 21/302* (2013.01); *H01L 21/3065* (2013.01); *H01L 21/30621* (2013.01); *H01L 21/3105* (2013.01); *H01L 21/31122* (2013.01); *H01L 21/321* (2013.01); *H01L 21/32136* (2013.01); *H01J 2237/334* (2013.01)

(56) References Cited

U.S. PATENT DOCUMENTS

| | | |
|---|---|---|
| 6,177,353 B1 | 1/2001 | Gutsche et al. |
| 6,448,192 B1 | 9/2002 | Kaushik |
| 6,482,745 B1 | 11/2002 | Hwang |
| 7,049,266 B2 | 5/2006 | Chung |
| 7,196,955 B2 | 3/2007 | Nickel |
| 7,795,148 B2 | 9/2010 | Brown |
| 7,943,527 B2 | 5/2011 | Kumar |
| 8,110,503 B2 | 2/2012 | Kumar |
| 8,227,344 B2 | 7/2012 | Selsley |
| 8,252,194 B2 | 8/2012 | Kiehlbauch et al. |
| 8,883,028 B2 | 11/2014 | Kanarik |
| 8,993,352 B2 | 3/2015 | Nishimura et al. |
| 9,130,158 B1 | 9/2015 | Shen et al. |
| 9,240,315 B1 | 1/2016 | Hsieh |
| 9,257,638 B2 | 2/2016 | Tan et al. |
| 9,449,843 B1 | 9/2016 | Korolik et al. |
| 9,576,811 B2 | 2/2017 | Kanarik et al. |
| 9,806,252 B2 | 10/2017 | Tan et al. |
| 9,837,312 B1 | 12/2017 | Tan et al. |
| 9,984,858 B2 * | 5/2018 | Kanarik ................ H01J 37/321 |
| 10,056,268 B2 * | 8/2018 | Li ....................... H01L 21/4853 |
| 10,096,487 B2 * | 10/2018 | Yang ........................ C23F 4/00 |
| 2001/0053585 A1 | 12/2001 | Kikuchi et al. |
| 2002/0009883 A1 | 1/2002 | Ogure et al. |
| 2002/0058409 A1 | 5/2002 | Lin et al. |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0006222 A1 | 1/2005 | Ding et al. |
| 2005/0098440 A1 | 5/2005 | Kailasam et al. |
| 2005/0112901 A1 | 5/2005 | Ji |
| 2006/0009040 A1 | 1/2006 | Tomioka et al. |
| 2006/0194435 A1 | 8/2006 | Nishimura et al. |
| 2007/0049036 A1 | 3/2007 | Huang |
| 2007/0202254 A1 | 8/2007 | Ganguli et al. |
| 2007/0238301 A1 | 10/2007 | Cabral et al. |
| 2007/0246442 A1 | 10/2007 | America et al. |
| 2009/0020884 A1 | 1/2009 | Lee et al. |
| 2009/0075472 A1 | 3/2009 | Arnold et al. |
| 2009/0226611 A1 | 9/2009 | Suzuki et al. |
| 2009/0256220 A1 | 10/2009 | Horng et al. |
| 2010/0048029 A1 | 2/2010 | Kumar |
| 2011/0139748 A1 | 6/2011 | Donnelly et al. |
| 2011/0200762 A1 | 8/2011 | Kumar |
| 2011/0212274 A1 | 9/2011 | Selsley |
| 2012/0009785 A1 | 1/2012 | Chandrashekar et al. |
| 2012/0115329 A1 | 5/2012 | Chandrashekar et al. |
| 2012/0276657 A1 | 11/2012 | Joubert et al. |
| 2013/0105303 A1 | 5/2013 | Lubomirsky et al. |
| 2013/0168354 A1 | 7/2013 | Kanarik |
| 2014/0134847 A1 | 5/2014 | Seya |
| 2014/0193979 A1 | 7/2014 | Or |
| 2015/0037972 A1 | 2/2015 | Danek et al. |
| 2015/0214474 A1 | 7/2015 | Nishimura et al. |
| 2015/0270140 A1 | 9/2015 | Gupta et al. |
| 2016/0020152 A1 | 1/2016 | Posseme |
| 2016/0064244 A1 | 3/2016 | Agarwal et al. |
| 2016/0203995 A1 | 7/2016 | Kanarik |
| 2016/0308112 A1 | 10/2016 | Tan et al. |
| 2016/0314985 A1 | 10/2016 | Yang et al. |
| 2016/0358782 A1 | 12/2016 | Yang |
| 2016/0379824 A1 | 12/2016 | Wise et al. |
| 2017/0040214 A1 | 2/2017 | Lai et al. |
| 2017/0053810 A1 | 2/2017 | Yang |
| 2017/0069462 A1 | 3/2017 | Kanarik et al. |
| 2017/0186621 A1 | 6/2017 | Zaitsu |
| 2017/0229311 A1 | 8/2017 | Tan et al. |
| 2017/0229314 A1 | 8/2017 | Tan et al. |
| 2017/0243755 A1 | 8/2017 | Tapily |
| 2017/0256416 A1 | 9/2017 | Fischer et al. |
| 2017/0316935 A1 | 11/2017 | Tan et al. |
| 2018/0019387 A1 | 1/2018 | Tan et al. |
| 2018/0327913 A1 | 11/2018 | Lansalot-Matras et al. |

OTHER PUBLICATIONS

U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated Mar. 24, 2017 issued in U.S. Appl. No. 15/286,421.
U.S. Notice of Allowance dated Sep. 28, 2017 issued in U.S. Appl. No. 15/286,421.
U.S. Office Action dated Jul. 25, 2017 issued in U.S. Appl. No. 14/830,683.
U.S. Office Action dated Aug. 25, 2017 issued in U.S. Appl. No. 15/239,138.
Boullart et al. (Mar. 29, 2013) "STT MRAM patterning challenges," *Proc. SPIE, Advanced Etch Technology for Nanopatterning II, Proc. of SPIE* 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," *ECS Journal of Solid State Science and Technology*,4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.
Faraz et al. (2015) "Atomic Layer Etching: What Can We Learn from Atomic Layer Deposition?," *ECS Journal of Solid State Science and Technology*, 4(6):N5023-N5032.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.

(56) References Cited

OTHER PUBLICATIONS

Kanarik et al. (Mar./Apr. 2015) "Overview of atomic layer etching in the semiconductor industry," *J. Vac. Sci. Technol. A*, 33(2):020802-1-020802-14.

Kanarik et al. (2017) "Predicting synergy in atomic layer etching," *J. Vac. Sci. Technol. A*,35(5):05C302-1 through 05C302-7.

Kim et al. (Nov./Dec. 2013) "Atomic layer etching removal of damaged layers in a contact hole for low sheet resistance," *J. Vac. Sci. Technol. A*, 31(6):061302-1-061302-7.

Lee et al. (2015) "Atomic Layer Etching of $Al_2O_3$ Using Sequential, Self-Limiting Thermal Reactions with $Sn(acac)_2$ and Hydrogen Fluoride," *ACSNANO*,9(2):2061-2070.

Moroz, Paul (Jul. 1-2, 2015) "Numerical Simulation of Atomic Layer Etching," Atomic Layer Etching Workshop, Portland, Oregon, USA; *Tokyo Electron U.S. Holdings, Inc.*, 15pp.

Park, S.D. et al., "Surface Roughness Variation during Si Atomic Layer Etching by Chlorine Adsorption Followed by an Ar Neutral Beam Irradiation", *Electrochem.. Solid-State Lett.*, (Sep. 22, 2005), vol. 8, Issue 11, C177-C179. (Abstract Only).

Pomeroy, R.K. and Wijesekera, K.S. (1980) "Preparation and derivatives of cis-$M(CO)_4(SiCl_3)_2$ (M=Fe, Ru, Os)," *Inorg. Chem.*, 19(12):3729-3735.

Schmitt et al. (2006) "Synthesis and Properties of Single-Crystal FeSi Nanowires," *Nano Lett.*, 6(8):1617-1621.

Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.

Wolf, S. and Tauber, R.N. (1986) "Silicon Processing for the VLSI Era," *vol. 1—Process Technology, Lattice Press*, pp. 542-557.

U.S. Appl. No. 15/494,245, filed Apr. 21, 2017, Tan et al.

U.S. Appl. No. 15/719,497, filed Sep. 28, 2017, Tan et al.

U.S. Appl. No. 15/799,675, filed Oct. 31, 2017, Smith et al.

U.S. Office Action dated Aug. 7, 2017 issued in U.S. Appl. No. 15/253,481.

U.S. Final Office Action dated Jan. 25, 2018 issued in U.S. Appl. No. 15/253,481.

U.S. Notice of Allowance dated Feb. 12, 2018 issued in U.S. Appl. No. 15/253,481.

U.S. Office Action dated Oct. 10, 2018 issued in U.S. Appl. No. 15/423,486.

U.S. Office Action dated Feb. 26, 2019 issued in U.S. Appl. No. 15/423,486.

U.S. Office Action dated Apr. 19, 2018 issued in U.S. Appl. No. 15/494,245.

U.S. Notice of Allowance dated Dec. 13, 2018 issued in U.S. Appl. No. 15/494,245.

U.S. Notice of Allowance [Supplemental Notice of Allowability] dated Oct. 26, 2017 issued in U.S. Appl. No. 15/286,421.

International Search Report and Written Opinion dated Feb. 25, 2019 issued in Application No. PCT/US2018/055065.

Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.

U.S. Office Action dated Jan. 14, 2019 issued in U.S. Appl. No. 15/799,675.

\* cited by examiner

ALE SMOOTHNESS: IN AND OUTSIDE SEMICONDUCTOR INDUSTRY

CROSS-REFERENCE TO RELATED APPLICATION

This application is a continuation of U.S. patent application Ser. No. 15/253,481, filed Aug. 31, 2016, and titled "ALE SMOOTHNESS: IN AND OUTSIDE SEMICONDUCTOR INDUSTRY", now allowed, which claims benefit of U.S. Provisional Patent Application No. 62/214,813, filed Sep. 4, 2015, and titled "ALE SMOOTHNESS: IN AND OUTSIDE SEMICONDUCTOR INDUSTRY," which is incorporated by reference herein in its entirety and for all purposes.

BACKGROUND

Semiconductor fabrication often involves etching thin films, but often smooth films perform better and are more desirable in fabrication processes. Various conventional etch methods result in rough films. Conventional methods for smoothing are limited in application.

SUMMARY

Provided herein are methods and apparatuses for processing substrates. One aspect involves a method of etching and smoothening a substrate surface, the method including: exposing a substrate surface to a reactant and igniting a first plasma to modify a layer of the surface; and exposing the modified layer to an inert gas and igniting a second plasma at a bias power and for a duration sufficient to remove the modified layer without sputtering, whereby the substrate surface after removing the modified layer is smoother than the substrate surface before exposing the substrate surface to the reactant.

In some embodiments, the substrate surface includes a material selected from the group consisting of aluminum gallium nitride, silicon, gallium nitride, tungsten, and cobalt. In some embodiments, the substrate surface includes germanium and the bias power is between about 20 $V_b$ and about 35 $V_b$. In various embodiments, the substrate surface includes silicon and the bias power is between about 35 $V_b$ and about 65 $V_b$. In some embodiments, the substrate surface includes gallium nitride and the bias power is between about 50 $V_b$ and about 100 $V_b$. In various embodiments, the substrate surface includes tungsten and the bias power is between about 70 $V_b$ and about 80 $V_b$.

In some embodiments, the substrate surface includes amorphous carbon and the reactant is oxygen.

In various embodiments, the reactant is a halogen-containing reactant. In various embodiments, the reactant is a boron-containing halide. In some embodiments, the reactant is a combination of chlorine and boron trichloride.

In some embodiments, the inert gas is selected from the group consisting of nitrogen, argon, neon, helium, and combinations thereof. In some embodiments, the bias power is less than about 100 $V_b$. In some embodiments, the method also includes repeating (a) and (b). In some embodiments, a process chamber housing a substrate including the substrate surface may be purged after (a) and before (b). In various embodiments, a roughness of substrate surface before exposing the substrate to the reactant is about 100 nm.

Disclosed embodiments may be used for various applications in and outside the semiconductor industry. In some embodiments, the substrate surface is on a substrate including a reflective, multi-layer film used as a mask for ultraviolet lithography.

In various embodiments, ions generated in the second plasma are directed towards the substrate surface at an angle. In some embodiments, the ions are generated from a rotating component.

In various embodiments, the substrate surface is smoothened to decrease surface area of the substrate surface and reduce reactivity in medical applications.

In some embodiments, the substrate surface is smoothened to form a smoothened surface for use in precision optics for space or military applications.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
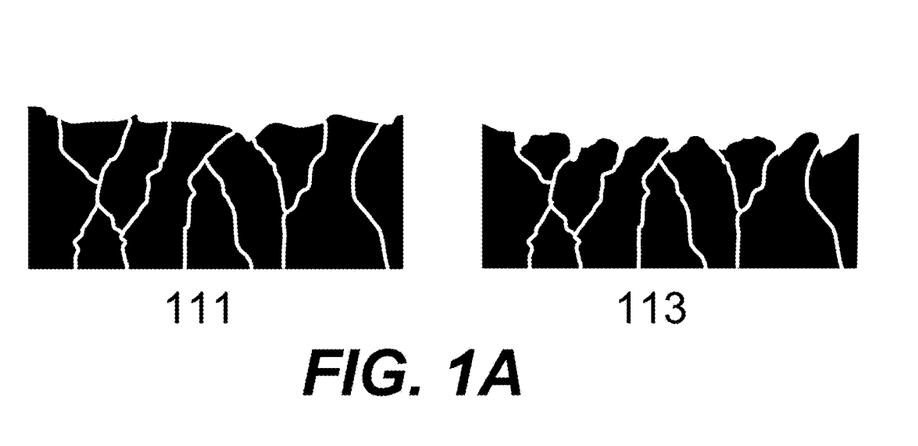
FIG. 1A is a schematic illustration of an example of a substrate with grains of a material before and after a wet etch process.

Semiconductor fabrication processes often involve etching of thin films and fabrication of smooth films. In various applications, smooth films are desirable as they may improve performance and reliability of a semiconductor device. Various conventional etch and deposition processes result in rough films. For example, a wet etch process typically results in an unevenly etched surface. FIG. 1A shows an example of substrate material grains that undergo wet etch. In 111, before an etch process, the grains are slightly uneven in thickness at the field region of the material, and after the wet etch, as shown in 113, although the grains are etched, the field region of the material shows significant roughness and variability across the material.

While some methods for smoothening rough films are conventionally used, these methods have limitations in their applications to various fabrication processes. In many conventional methods, smoothening of the surface of materials in features is also challenging. For example, one method of smoothening films is performing chemical mechanical polishing (CMP). CMP is typically performed to planarize a substrate, and smoothens the whole surface of the substrate but is not selective to specific materials. If there are features on the substrate, CMP removes any patterning on the surface of the substrate. Additionally, CMP is not a controllable process in that planarized surfaces on a substrate may not be uniform across an entire substrate.

In another example, argon used in ion beam etching has been conventionally used in smoothing films, such as for line width roughness applications. However, such processes often do not result in both etching and smoothening simultaneously, and is not self-limiting. Argon ion beam etching often involves sputtering at high bias power to remove etched film but due to the size of the beam used to etch, such methods are not scalable and therefore are incapable of smoothening films over a large area, such as over the surface of a whole substrate. Conventional methods of atomic layer etching maintain the same smoothness of the surface by etching in self-limiting reactions but have limited application in smoothening films.

Provided herein are methods of etching and smoothening films simultaneously using an etch process capable of smoothening various types of materials, and horizontal and vertical surfaces such as over features, on field regions, and on sidewalls in a scalable process. The term "smoothen" as used herein may refer to making the surface of a material smoother than before etching the material, as measured by atomic force microscopy (AFM) measurement, or as measured visually by inspecting a high resolution transmission electron microscopy (HR-TEM) image. In various embodiments, the etching process is substantially self-limiting.

Figure 1B:
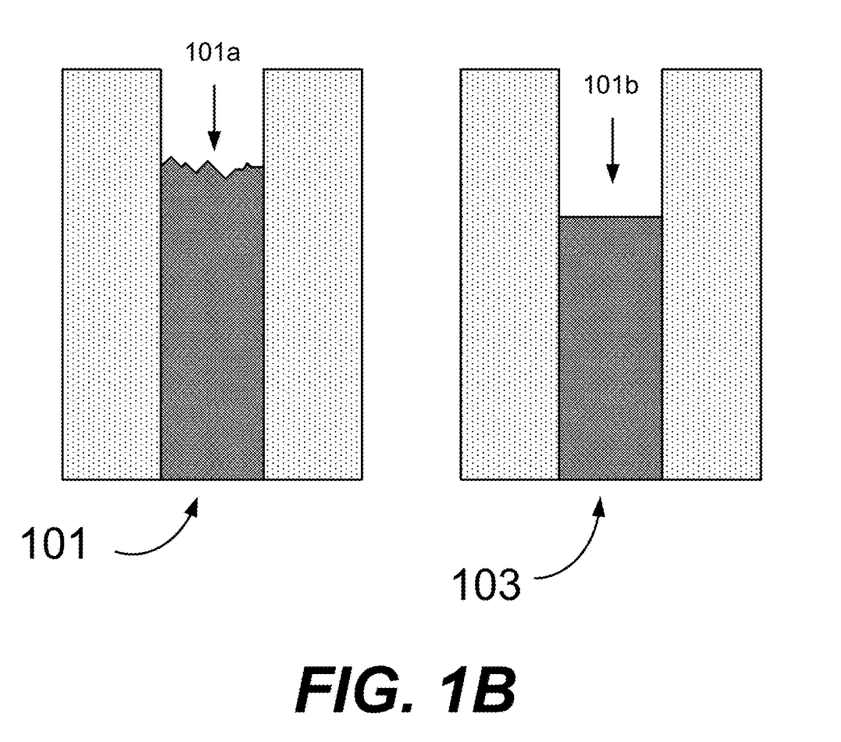
FIG. 1B is a schematic illustration of an example of a substrate with a feature filled with material before and after performing certain embodiments.

FIG. 1B shows an example of a substrate with a feature filled with a material before and after etch. In 101, the surface of the material 101a is rough, and after an etch process such as one described herein, in 103 a smooth etched surface 101b is shown at the surface of the feature.

Disclosed embodiments involve etching and smoothening using atomic layer etching (ALE). ALE is a technique that removes thin layers of material using sequential self-limiting reactions. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In disclosed embodiments, ALE is performed with a plasma.

ALE may be performed in cycles. The concept of an "ALE cycle" is relevant to the discussion of various embodiments herein. Generally an ALE cycle is the minimum set of operations used to perform an etch process one time, such as etching a monolayer. In disclosed embodiments, more than one monolayer may be etched in each cycle. For example, about 1 to about 3 monolayers may be etched in each cycle. The result of one cycle is that at least some of a surface or film layer on a substrate surface is etched. Typically, an ALE cycle includes a modification operation to form a reactive layer, followed by a removal operation to remove or etch only this modified layer. The reactive layer is more susceptible to removal than an unmodified layer. The cycle may include certain ancillary operations such as sweeping or removing one of the reactants or byproducts. Generally, a cycle contains one instance of a unique sequence of operations. As an example, an ALE cycle may include the following operations: (i) delivery of a reactant gas and/or plasma, (ii) purging of the reactant gas from the chamber, (iii) delivery of a removal gas and a plasma or bias, and (iv) purging of the chamber.

Figure 1C:
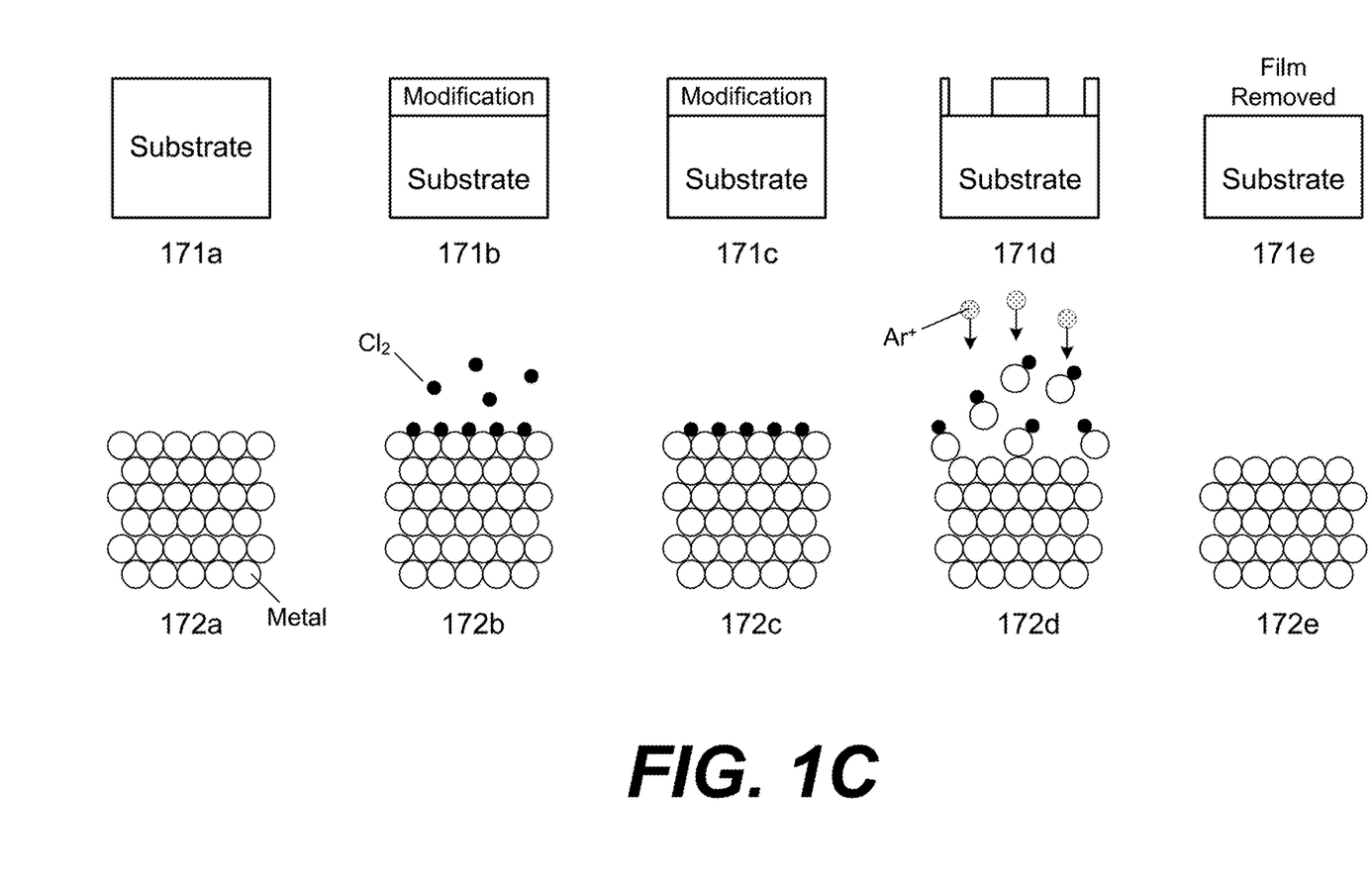
FIG. 1C is a schematic illustration of an example of atomic layer etching of film on a substrate.

FIG. 1C shows two example schematic illustrations of an ALE cycle. Diagrams 171a-171e show a generic ALE cycle. In 171a, the substrate is provided. In 171b, the surface of the substrate is modified. In 171c, the next step is prepared. In 171d, the modified layer is being etched. In 171e, the modified layer is removed. Similarly, diagrams 172a-172e show an example of an ALE cycle for etching a metal film. In 172a, a silicon substrate is provided, which includes many metal atoms. In 172b, reactant gas chlorine is introduced to the substrate which modifies the surface of the substrate. The schematic in 172b shows that some chlorine is adsorbed onto the surface of the substrate as an example. Although chlorine is depicted in FIG. 1B, any chlorine-containing compound or suitable reactant may be used. In 172c, the reactant gas chlorine is purged from the chamber. In 172d, a removal gas argon is introduced with a directional plasma as indicated by the $Ar^+$ plasma species and arrows, and ion bombardment is performed to remove the modified surface of the substrate. During this operation, a bias is applied to the substrate to attract ions toward it. In 172e, the chamber is purged and the byproducts are removed. In some embodiments, ALE is performed to selectively etch a material relative to another material.

Disclosed embodiments are capable of etching and smoothening various materials at the same time. For example, each cycle of ALE may smoothen both metals and dielectrics in some embodiments. Disclosed embodiments are also capable of smoothing both horizontal and vertical surfaces of features and structures on the substrate. For example, disclosed embodiments may be suitable for smoothening the field region of blanket substrates, but may also be suitable for etching and smoothening sidewalls of features. This may be suitable for smoothening and etching sidewalls for FinFET fabrication, for example. Disclosed embodiments are also scalable, thereby capable of etching and smoothening films across an entire wafer. Disclosed embodiments may be integrated with other processes, such as deposition, CMP, and/or other processes for increasing uniformity across a substrate. For example, in some embodiments, disclosed embodiments may be used to etch and smoothen metal material while depositing metal material by alternating between performing disclosed embodiments and depositing metal. In some embodiments, disclosed embodiments may be used after performing CMP on a substrate, modulating temperature across a wafer to improve uniformity to smoothen a deposited film. Disclosed embodiments may benefit industries within the semiconductor industry and outside of the semiconductor industry. Examples of applications may include recess etches (such as for metals), EUV masks, optics, mechanics, aerospace, coatings.

Figure 2:
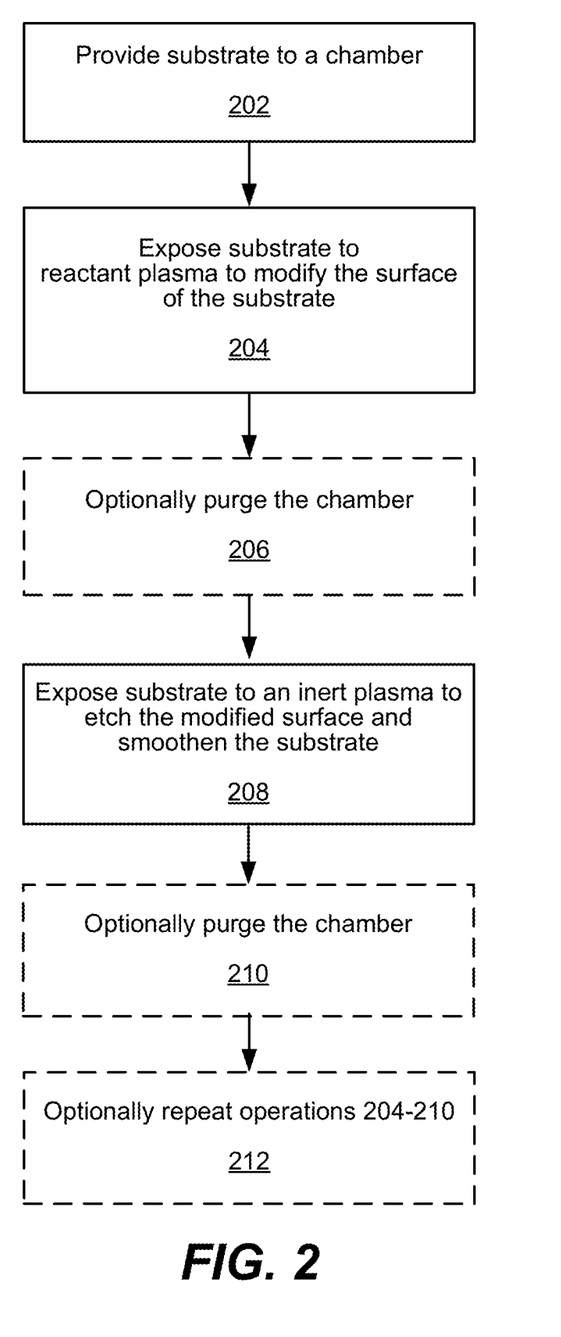
FIG. 2 is a process flow diagram of operations performed in accordance with disclosed embodiments.

Process operations for performing disclosed embodiments are further described with respect to FIG. 2. FIG. 2 depicts operation 202, whereby a substrate is provided to a chamber, such as a process chamber within a tool suitable for processing substrates such as semiconductor substrates. The chamber may be a chamber in a multi-chamber apparatus or a single-chamber apparatus.

The substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a blanket layer of silicon, such as amorphous silicon, or a blanket layer of germanium. The substrate may include a patterned mask layer previously deposited and patterned on the substrate. For example, a mask layer may be deposited and patterned on a substrate including a blanket amorphous silicon layer.

In some embodiments, the layers on the substrate may be patterned. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the surface of the substrate may include more than one type of material, such as if the substrate is patterned. The substrate includes at least one material to be etched and smoothened using disclosed embodiments. This material may be any of those described above—metals, dielectrics, semiconductor materials, and others. In various embodiments, these materials may be prepared for fabricating contacts, vias, gates, etc. In some embodiments, the material to be etched is a hard mask material, such as amorphous carbon. Further example materials include aluminum gallium nitride, silicon, gallium nitride, tungsten, and cobalt.

In some embodiments, the features may have aspect ratios of at least about 2:1, at least about 4:1, at least about 6:1, at least about 10:1, at least about 30:1, or higher. Protection of feature sidewalls may be desirable at high aspect ratios. Disclosed methods may be performed on substrates with features having an opening less than about 150 nm. A feature via or trench may be referred to as an unfilled feature or a feature. A feature that may have a re-entrant profile that narrows from the bottom, closed end, or interior of the feature to the feature opening. In some embodiments, the methods described herein may be used to form features having these characteristics.

In some embodiments, the substrate may undergo pre-processing to remove any residual oxides on the surface of the substrate materials prior to performing disclosed embodiments. For example, in some embodiments, substrates may be prepped by dipping the substrate into hydrogen fluoride (HF) prior to performing disclosed embodiments.

In operation 204, the substrate is exposed to a reactant with a plasma to modify a surface of the substrate. The modification operation forms a thin, reactive surface layer with a thickness that is more easily removed than the un-modified material in the subsequent removal operation. The reactant may be a halogen-containing reactant, or oxygen. In some embodiments, a boron-containing halide reactant may be used. Any combination of these reactants may be used during operation 204. For example, in some embodiments, operation 204 involves exposing the substrate to chlorine ($Cl_2$). In some embodiments, operation 204 involves exposing the substrate to chlorine and boron trichloride ($Cl_2/BCl_3$ combination). In various embodiments, using a boron-containing halide reactant may yield smoother films than films exposed to a non-boron-containing halide reactant during operation 204. For example, $BCl_3$ may improve smoothness by removing oxidation that may otherwise cause micromasking during etching.

In some embodiments, operation 204 involves exposing the substrate to oxygen. For example, where the substrate includes amorphous carbon to be etched and smoothened, the amorphous carbon may be exposed to oxygen. The plasma used in operation 204 may depend on the material to be etched and smoothened.

In some embodiments, a carrier gas may be flowed during operation 204. Example carrier gases include inert gases such as $N_2$, Ar, Ne, He, and combinations thereof.

In some embodiments, a substrate may be chlorinated by introducing chlorine into the chamber. Chlorine is used as an example etchant species in disclosed embodiments, but it will be understood that in some embodiments, a different etching gas is introduced into the chamber. The etching gas may be selected depending on the type and chemistry of the substrate to be etched. A plasma is ignited and chlorine plasma reacts with the substrate to form a modified layer on the surface of the substrate. For example, where the substrate is tungsten, chlorine plasma reacts with tungsten to modify the surface of the tungsten film. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above. The species generated from a chlorine plasma can be generated directly by forming a plasma in the process chamber housing the substrate or they can be generated remotely in a process chamber that does not house the substrate, and can be supplied into the process chamber housing the substrate.

In various embodiments, the plasma may be an inductively coupled plasma or a capacitively coupled plasma. The plasma conditions and duration of performing operation 204 depend on the type of material being modified and the reactant used to generate the plasma. For example, the plasma conditions and duration used for modifying a metal material on a substrate may be different from plasma conditions and duration used for modifying a dielectric material. The duration may be sufficient to modify at least most of a surface of the material on the substrate, or at least a monolayer of the surface.

In some embodiments, an inductively coupled plasma may be set at a plasma between about 50 W and about 2000 W. In some embodiments, a bias may be applied between about 0V and about 500V.

Without being bound by a particular theory, it is believed that modification may cause the surface of the substrate to be more uneven than an unmodified layer. For example, adsorption or modification of the surface using chlorine plasma may cause steric hindrance on the surface of the substrate whereby one or more chlorine atoms bonded to one or more atoms of the material on the substrate causes an uneven surface. Without being bound by a particular theory, it is believed that substrates may be smoothened by disclosed embodiments due to the layer-by-layer mechanism by which ALE etches material, thereby etching and smoothening protrusions on a surface of the substrate during each cycle. For example, a protrusion on the surface of material to be smoothened may be modified and etched on the surfaces of the protrusions such that as the protrusion is etched, the size of the protrusion shrinks with each etching cycle, thereby smoothening the surface of the material.

In various embodiments, disclosed embodiments may be used to etch and smoothen metal or semiconductor or dielectric materials. Materials may be grown with grain boundaries. Some materials may be epitaxial or amorphous. Disclosed embodiments are capable of smoothening certain frequencies of roughness. For example, in various embodiments, disclosed embodiments may be unable to improve roughness on a large scale, such as greater than 100 nm, but may be suitable for smoothening "microroughness" which may be defined as having a roughness less than about 100 nm. In some embodiments, disclosed embodiments can be used to smoothen films having a roughness of about 100 nm.

Returning to FIG. 2, in operation 206, the chamber is optionally purged. A purge may be performed after a modification operation. In a purge operation, non-surface-bound active reactant species may be removed from the process chamber. This can be done by purging and/or evacuating the process chamber to remove the reactant species, without removing the adsorbed or modified layer. The species generated in a reactant plasma can be removed by simply stopping the plasma and allowing the remaining species to decay, optionally combined with purging and/or evacuation of the chamber. Purging can be done by flowing any inert gas such as $N_2$, Ar, Ne, He, and combinations thereof.

In operation 208, the substrate is exposed to an inert plasma to etch the modified surface and smoothen the substrate. Example inert gases that may be used include argon, xenon, neon. In some embodiments, helium may be used. The inert gas is ignited to form a plasma and form an activated gas, such as $Ar^+$. In various embodiments the activated gas may include charged species. The plasma may be an in situ or remote plasma. The plasma may be generated using a power between about 100 W and about 1500 W.

During this operation a low bias is applied. The bias power depends on the chemistry of the inert gas, the plasma conditions for generating the activated gas, and the material being etched and smoothened during this operation. In various embodiments, depending on these factors, the range of bias levels suitable for performing disclosed embodiments may be referred to as a "window." A bias window suitable for disclosed embodiments may be determined empirically and is selected so as not to physically sputter the activated gas onto the material to be etched and smoothened. This operation is performed to maintain the self-limiting nature of an ALE process. As such, the bias power used is such that the modified layer on the material may be removed without physically sputtering the material underneath it. In various embodiments, this operation may etch a few monolayers of material and smoothen the surface of the material.

Figure 3:
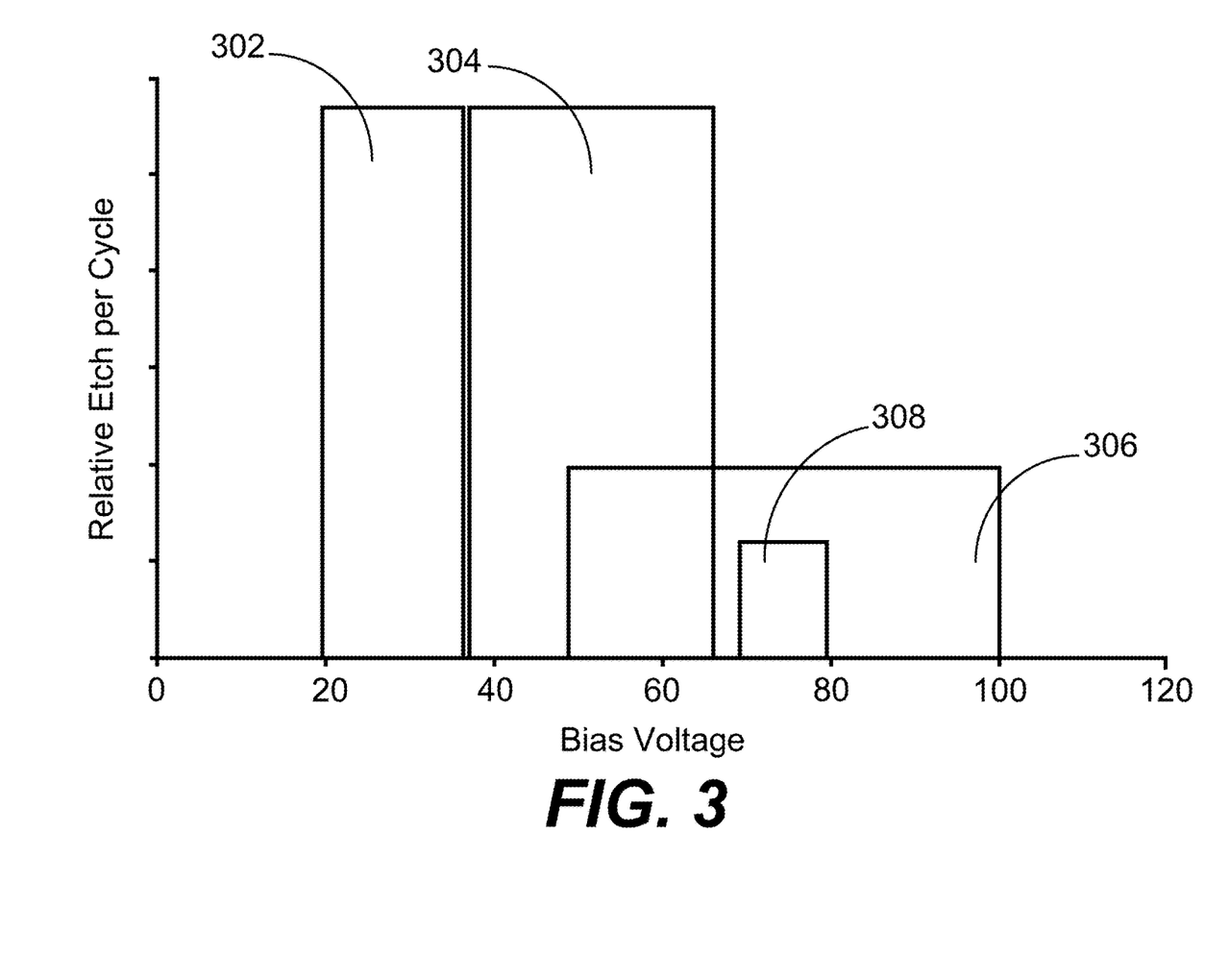
FIG. 3 is a graph depicting experimental results of example bias windows for various materials.

FIG. 3 shows an example of various bias windows for an argon-based plasma used during the removal operation. These examples involve using a chlorine-based plasma to modify a surface of the substrate and an argon-based plasma during removal. The windows are determined empirically from experiments for different materials. The window width is an indication of the strength of surface modification performed in operation 204. That is, if the reactant plasma used in operation 204 bonds well to the material to be etched and smoothened, the window is wide. If the reactant plasma used in operation 204 has a lower adsorption rate or is less capable of bonding to the material to be etched and smoothened, the window is narrow. The window height, as correlated with etch rate per cycle as shown in FIG. 3, depends on the bias conditions (plasma power, plasma frequency, etc.) and the material being etched and smoothened.

FIG. 3 shows a Ge bias window 302 of about 20-35 $V_b$ for germanium. As described above, this indicates that a bias power between about 20 $V_b$ and 35 $V_b$ may be suitable for etching and smoothening germanium using an argon-based plasma during removal. FIG. 3 also shows other bias windows: Si bias window 304 between about 35 $V_b$ and about 65 $V_b$ for etching and smoothening silicon, GaN bias window 306 between about 50 $V_b$ and about 100 $V_b$ for etching and smoothening gallium nitride, and W bias window 308 between about 70 $V_b$ and about 80 $V_b$ for etching and smoothening tungsten. In various embodiments, the bias power is less than about 100 $V_b$.

Returning to FIG. 2, operation 208 is performed for a duration sufficient to remove at least most or all of the modified layer. In some embodiments, a greater smoothening effect may be observed where operation 208 is performed for a duration sufficient to remove the entire modified layer from the substrate.

Without being bound by a particular theory, it is believed that during the removal operation, removal of the modified layer from the surface of the substrate may rearrange bonds on the material surface (e.g., removal of the modified layer from the surface of the substrate may permit surface diffusion) such that the surface of the material is smoother than that of the surface prior to etching using disclosed embodiments.

In operation 210, the chamber is optionally purged to remove etched byproducts. Purge processes may be any of those used for a purge after a modification operation.

In operation 212, operations 204-210 may be optionally repeated. In various embodiments, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

Disclosed embodiments may be suitable for application with various semiconductor fabrication processes or even processes outside the semiconductor industry. For example, some semiconductor applications include fabrication of masks for ultraviolet lithography to form a reflective, multi-layer film. Mask line edge roughness (LER) may be increased due to electron shot noise, but may secondarily be affected by the roughness of multilayers (such as about 40 layers). Sidewalls may be smoothened in some embodiments due to a glancing angle ion energy that allows for smoothening. For example, in some embodiments, ions may be generated such that ions are directed towards a substrate at an angle during a removal operation described herein to etch and smoothen vertical sidewalls. In some embodiments, the ions may be generated from a rotating component. Unlike an ionized cluster beam, disclosed embodiments may not use a wafer to be moved relative to a small beam—as a result, an entire 300 to 450 mm wafer may be simultaneously smoothened.

Applications outside semiconductor fabrication include solid state bonding, silicon on insulator fabrication, medical applications (such as decreasing a surface area to reduce reactivity or attack by pathogens), and precision optics for space or military applications.

Disclosed embodiments may be particularly suitable for etching and smoothening metals, since there are various challenges associated with depositing ultra-smooth metals, and metal grains typically have grain boundaries. One application would be to reduce sidewall LER. Another application may be to smoothen the top of a via.

Apparatus

Inductively coupled plasma (ICP) reactors which, in certain embodiments, may be suitable for cyclic deposition and activation processes, including atomic layer etching (ALE) operations, are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 4:
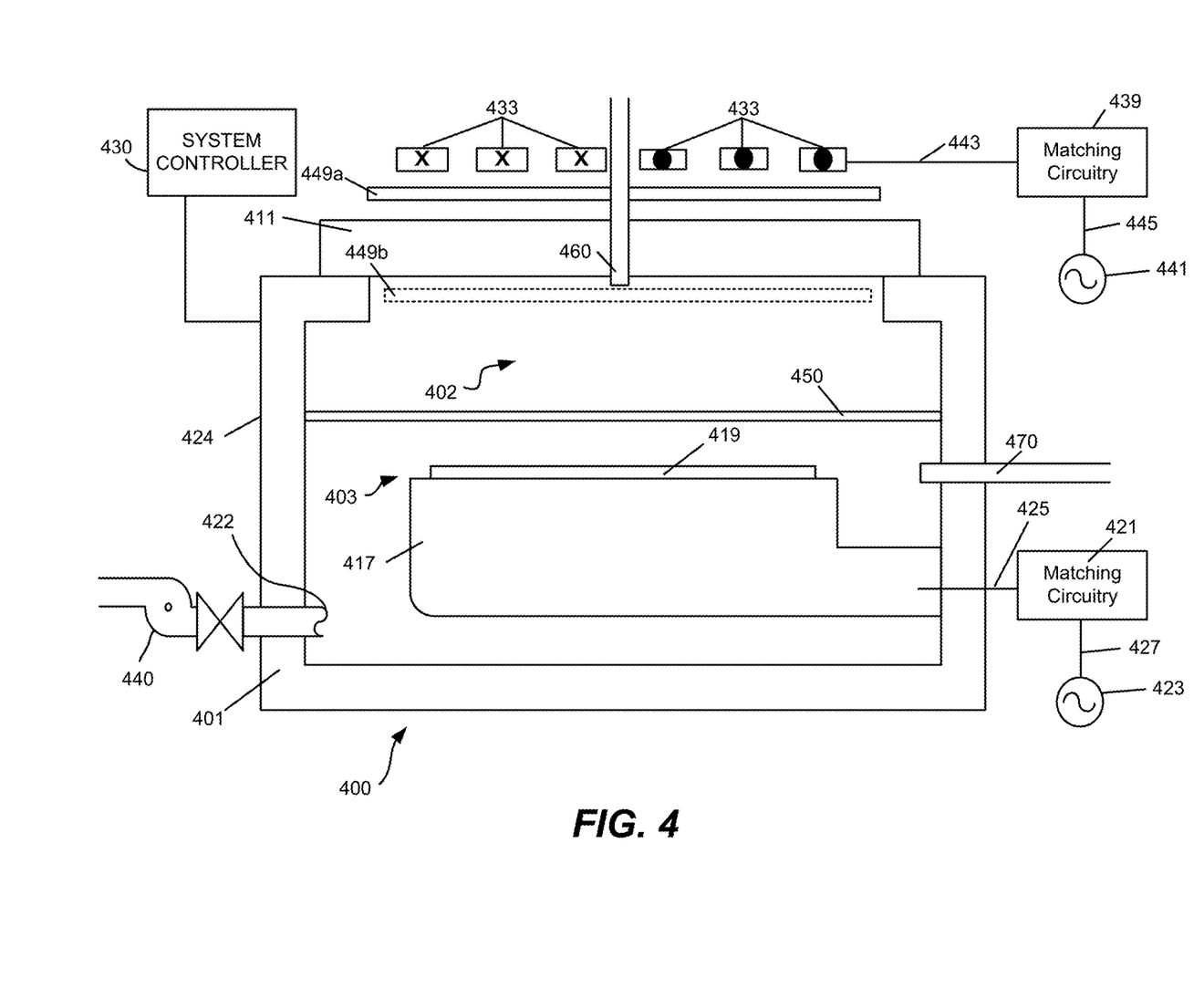
FIG. 4 is a schematic diagram of an example process chamber for performing certain disclosed embodiments.

FIG. 4 schematically shows a cross-sectional view of an inductively coupled plasma integrated etching and deposition apparatus 400 appropriate for implementing certain embodiments herein, an example of which is a Kiyo® reactor, produced by Lam Research Corp. of Fremont, Calif. The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and smoothening processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417. In various embodiments, a bias power of the electrostatic chuck may be set at less than about $100V_b$ or may be set at a different bias power depending on the process performed in accordance with disclosed embodiments. For example, the bias power may be between about 20 $V_b$ and about 100 $V_b$, or at a bias power to reduce physical sputtering of a plasma species onto a wafer.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "●" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449a is positioned between the coil 433 and the window 411. The Faraday shield 449a may be maintained in a spaced apart relationship relative to the coil 433. In some embodiments, the Faraday shield 449a is disposed immediately above the window 411. In some embodiments, the Faraday shield 449b is between the window 411 and the chuck 417. In some embodiments, the Faraday shield 449b is not maintained in a spaced apart relationship relative to the coil 433. For example, the Faraday shield 449b may be directly below the window 411 without a gap. The coil 433, the Faraday shield 449a, and the window 411 are each configured to be substantially parallel to one another.

Process and inert gases (e.g. halogen-containing gas, boron-containing halide gas, $BCl_3$, $Cl_2$, Ar, Xe, Ne, He, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump 440, e.g., a one or two stage mechanical dry pump and/or turbomolecular pump, may be used to draw process gases out of the process chamber 424 and to maintain a pressure within the process chamber 424. For example, the vacuum pump may be used to evacuate the lower sub-chamber 403 during a purge operation of ALE. A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases such as chlorine or argon, may be supplied through the gas flow inlets 460 and/or 470. In certain embodiments, process gases may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449a and/or optional grid 450 may include internal channels and holes that allow delivery of process gases to the process chamber 424. Either or both of Faraday shield 449a and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and selectively deposit layers on the wafer 419.

If the plasma grid 450 is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus 400 is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 403 through port 422. The chuck 417 disclosed herein may operate at elevated temperatures ranging between about 10° C. and about 250° C. The temperature will depend on the process operation and specific recipe.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. In some embodiments, the apparatus 400 includes a switching system for controlling flow rates and durations when disclosed embodiments are performed. In some embodiments, the apparatus 400 may have a switching time of up to about 500 ms, or up to about 750 ms. Switching time may depend on the flow chemistry, recipe chosen, reactor architecture, and other factors.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller, depending on the processing parameters and/or the type of system, may be programmed to control any of the processes disclosed herein, including the delivery of processing gases, bias power, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
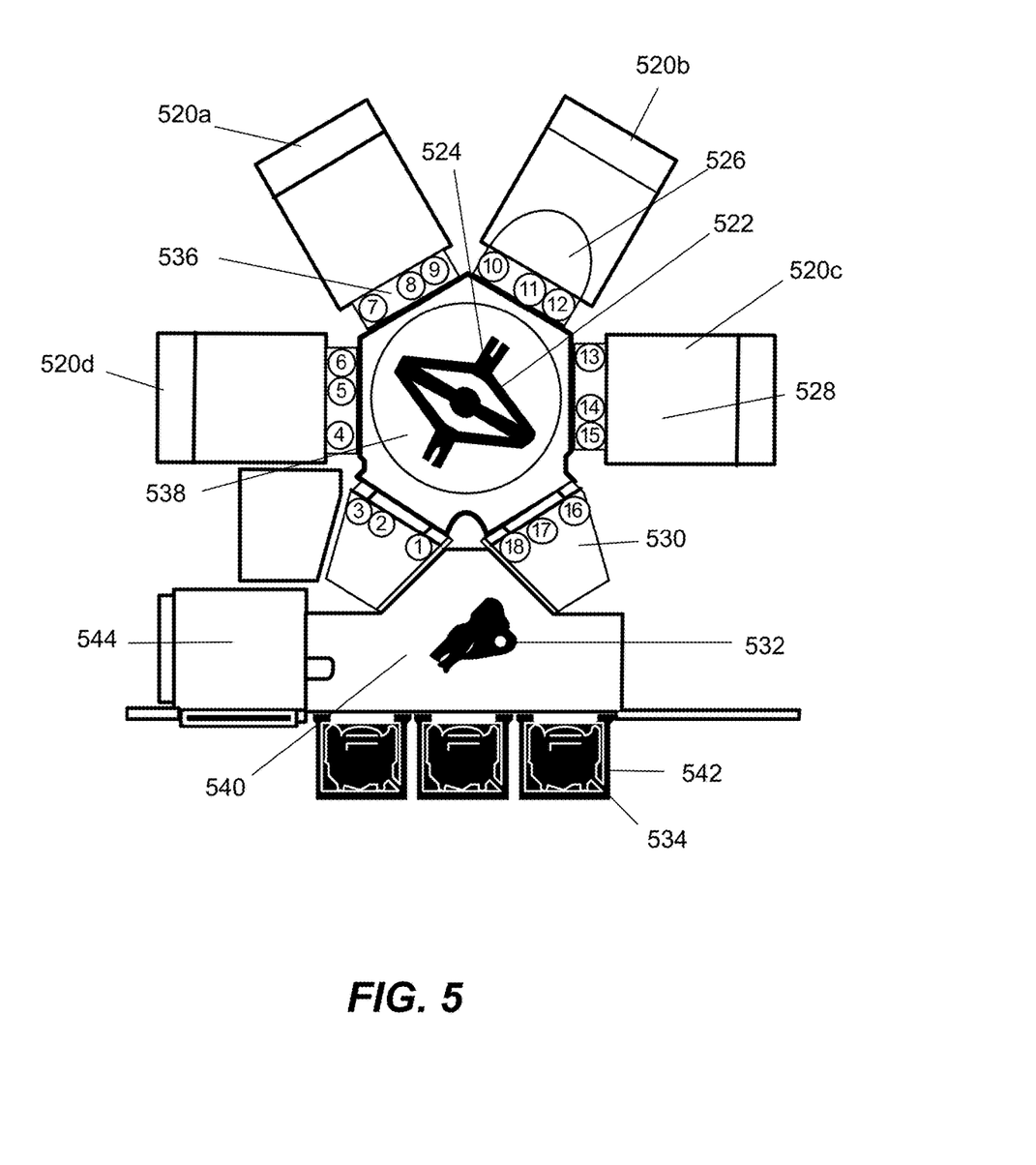
FIG. 5 is a schematic diagram of an example process apparatus for performing certain disclosed embodiments.

FIG. 5 depicts a semiconductor process cluster architecture with various modules that interface with a vacuum transfer module 538 (VTM). The arrangement of various modules to "transfer" wafers among multiple storage facilities and processing modules may be referred to as a "cluster tool architecture" system. Airlock 530, also known as a loadlock or transfer module, interfaces with the VTM 538 which, in turn, interfaces with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, disclosed operations may be performed in the same module. In some embodiments, disclosed operations may be performed in different modules of the same tool. One or more of the substrate etching processing modules (any of 520a-520d) may be implemented as disclosed herein, i.e., for etching and smoothening films of various materials, etching patterns, etching metal, and other suitable functions in accordance with the disclosed embodiments. Airlock 530 and processing modules 520a-520d may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside processing modules 520a-520d is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because the airlock 530 has the ability to match the environment between an ATM 540 and a VTM 538, the wafer 526 is able to move between the two pressure environments without being damaged. From the airlock 530, the wafer 526 is moved by robot 522 through VTM 538 and into one of the processing modules 520a-520d. In order to achieve this wafer movement, the robot 522 uses end effectors 524 on each of its arms. Once the wafer 526 has been processed, it is moved by robot 522 from the processing modules 520a-520d to the airlock 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 5.

EXPERIMENTAL

Experiment 1
Several substrates were exposed to cycles of chlorine plasma and argon plasma at various bias powers. These substrate materials included silicon, germanium, gallium nitride, tungsten, cobalt, and amorphous carbon. The results are summarized in FIGS. 6A, 6B, 7A, 7B, 8A, 8B, and 9A, and 9B, and in Table 1 below. Table 1 summarizes the roughness results and observations for silicon and germanium.

TABLE 1

Observations and Results for Experiment 1 for Silicon and Germanium

| Material | Pre-ALE | Post-ALE | Observations |
|---|---|---|---|
| Silicon | 0.28 nm RMS | 0.4 nm RMS (50 nm etch) | Visibly smoother High frequency |
| Germanium | 0.8 nm RMS | 0.9 nm RMS (65 nm etch) | Maintains smoothness |

Figure 6A:
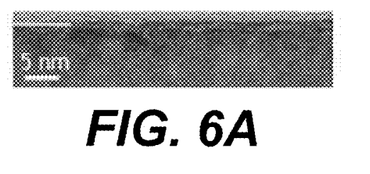
FIGS. 6A, 7A, 8A, and 9A are images of substrates used in experiments.
Figure 6B:
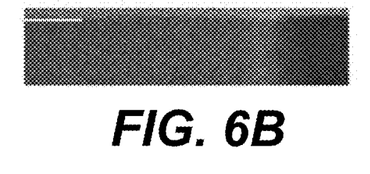
FIGS. 6B, 7B, 8B, and 9B are images of substrates after performing certain disclosed embodiments in experiments.

As shown, a silicon substrate shown in FIG. 6A has a roughness of 0.28 nm RMS before performing disclosed embodiments resulted in a post-ALE roughness as shown in FIG. 6B of 0.4 nm RMS after etching 50 nm. Although the value is higher, the substrate as shown is visibly smoother.

Figure 7A:
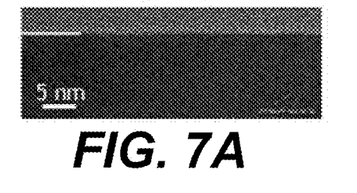
Figure 7B:
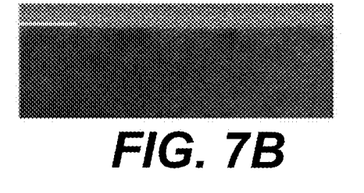

A germanium substrate shown in FIG. 7A having a roughness of 0.8 nm RMS before performing disclosed embodiments resulted in a post-ALE roughness as shown in FIG. 7B of 0.9 nm RMS after etching 65 nm. Note that in this experiment, the results suggested that smoothness was maintained.

Figure 8A:
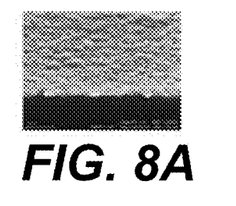
Figure 8B:
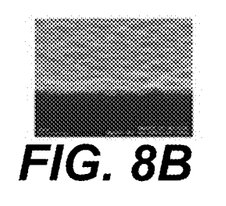

A tungsten substrate shown in FIG. 8A subject to disclosed embodiments resulted in a post-ALE substrate as shown in FIG. 8B after etching 6 nm of tungsten. The cycles of chlorine plasma and argon plasma with a bias smoothened the film.

Figure 9A:
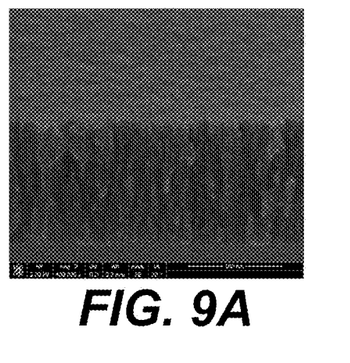
Figure 9B:
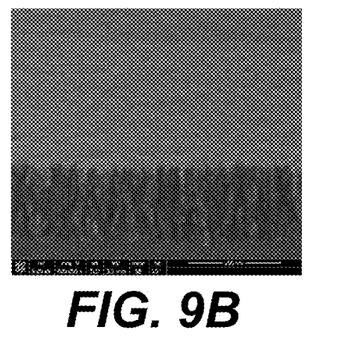

A substrate having amorphous carbon as shown in FIG. 9A had an initial roughness of 0.39 nm RMS. FIG. 9B shows a TEM image of the substrate after etching and smoothening. The substrate was exposed to cycles of oxygen plasma and an argon plasma at a bias of 60 $V_b$. A total of 50 nm of material was etched and the resulting roughness of the film was 0.28 nm RMS.

A gallium nitride substrate (not shown) having a roughness of 0.75 nm RMS before performing disclosed embodiments resulted in a post-ALE roughness of 0.55 nm RMS. The cycles of chlorine plasma and argon plasma with a bias etched 22 nm of material, and smoothened the film.

A cobalt substrate (not shown) having a roughness of 6-8 nm roughness per TEM before performing disclosed embodiments resulted in a post-ALE roughness of 2 nm roughness per TEM. The cycles of chlorine plasma and argon plasma with a bias smoothened the film.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method of etching and smoothening a substrate surface, the method comprising:
exposing a substrate surface comprising a material selected from the group consisting of amorphous carbon, aluminum gallium nitride, gallium nitride, tung- sten and cobalt to a reactant in a process chamber and igniting a first plasma to modify a layer of the surface;

purging the process chamber; and exposing the modified layer to an inert gas and igniting a second plasma at a bias power and for a duration sufficient to remove the modified layer without sputtering, wherein the substrate surface after removing the modified layer is smoother than the substrate surface before exposing the substrate surface to the reactant.

2. The method of claim 1, wherein the substrate surface comprises a material selected from the group consisting of aluminum gallium nitride, gallium nitride, tungsten and cobalt.

3. The method of claim 2, wherein the reactant is a halogen-containing reactant.

4. The method of claim 2, wherein the reactant is a boron-containing halide.

5. The method of claim 2, wherein the reactant is a combination of chlorine and boron trichloride.

6. The method of claim 1, wherein the substrate surface comprises amorphous carbon and the reactant is oxygen.

7. The method of claim 1, wherein the inert gas is selected from the group consisting of nitrogen, argon, neon, helium, and combinations thereof.

8. The method of claim 1, wherein the substrate surface comprises germanium and the bias is between about 20 $V_b$ and about 35 $V_b$.

9. The method of claim 1, wherein the substrate surface comprises gallium nitride and the bias is between about 50 $V_b$ and about 100 $V_b$.

10. The method of claim 1, wherein the substrate surface comprises tungsten and the bias is between about 70 $V_b$ and about 80 $V_b$.

11. The method of claim 1, wherein the substrate surface comprises amorphous carbon and the bias is about 60 $V_b$.

12. The method of claim 1, wherein the bias is less than about 100 $V_b$.

13. The method of claim 1, further comprising repeating the exposing the substrate surface to the reactant and the exposing the modified layer to the inert gas.

14. The method of claim 13, wherein the process chamber is purged after exposing the substrate surface to the reactant and before exposing the modified layer, and again after exposing the modified layer to the inert gas.

15. The method of claim 1, wherein roughness of the substrate surface before exposing the substrate surface to the reactant is about 100 nm.

16. The method of claim 1, wherein the substrate surface is on a substrate comprising a reflective, multi-layer film used as a mask for ultraviolet lithography.

17. The method of claim 1, wherein ions generated in the second plasma are directed towards the substrate surface at an angle.

18. The method of claim 17, wherein the ions are generated from a rotating component.

19. The method of claim 1, wherein the substrate surface is smoothened to decrease surface area of the substrate surface and reduce pathogenic reactivity.

20. The method of claim 1, wherein the substrate surface is smoothened to form a smoothened surface for use in precision optics.

* * * * *